United States Patent [19]

Kosonocky

[11] Patent Number: 4,607,429
[45] Date of Patent: Aug. 26, 1986

[54] METHOD OF MAKING A CHARGE-COUPLED DEVICE IMAGE SENSOR

[75] Inventor: Walter F. Kosonocky, Montgomery Township, Somerset County, N.J.

[73] Assignee: RCA Corporation, Princeton, N.J.

[21] Appl. No.: 717,725

[22] Filed: Mar. 29, 1985

[51] Int. Cl.[4] .................. H01L 21/265; H01L 21/26
[52] U.S. Cl. ................................ 29/572; 29/571; 29/576 B; 148/1.5; 148/187; 148/DIG. 82; 357/24; 357/91
[58] Field of Search .................. 29/572, 576 B, 571; 148/1.5, 187; 357/27, 91

[56] References Cited

U.S. PATENT DOCUMENTS

| | | | |
|---|---|---|---|
| 3,863,065 | 1/1975 | Kosonocky et al. | 250/211 J |
| 4,076,557 | 2/1978 | Huang et al. | 148/187 |
| 4,179,793 | 12/1979 | Hagiwara | 29/578 |
| 4,216,574 | 8/1980 | Feist | 29/578 |
| 4,360,963 | 11/1982 | Jastrzebski | 29/571 |
| 4,362,575 | 12/1982 | Wallace | 148/1.5 |
| 4,364,164 | 12/1982 | Bluzer et al. | 29/571 |
| 4,396,438 | 8/1983 | Goodman | 148/1.5 |

Primary Examiner—Upendra Roy
Attorney, Agent, or Firm—Birgit E. Morris; Donald S. Cohen

[57] ABSTRACT

The present invention relates to methods of forming a charge-coupled device (CCD) image sensor which includes in a substrate of semiconductor material a plurality of parallel channel regions, a channel stop region between alternate pairs of adjacent channel regions, a blooming drain region in the channel stop region between the other alternate pairs of adjacent channel regions and a blooming drain barrier region around each blooming drain. The positions of the channel stop regions, the blooming drain regions and the blooming drain barrier regions are defined by a masking layer having openings therethrough and the channel stop regions, blooming drain regions and blooming drain barrier regions are formed by embedding ions of an appropriate conductivity modifier into the substrate through the openings in the masking layer. The channel stop regions may be defined at the same time as the blooming drain barrier regions or at the same time as the blooming drains so as to provide accurate spacing between the blooming drain barrier regions and the channel stop regions. The channel stop regions and the blooming drain barrier regions are all formed simultaneously and the blooming drain regions are formed simultaneously but separately from the channel stop regions and the blooming drain barrier regions.

11 Claims, 11 Drawing Figures

METHOD OF MAKING A CHARGE-COUPLED DEVICE IMAGE SENSOR

The present invention relates to a method of making a frame-transfer charge-coupled device (CCD) image sensor having alternate blooming drains, and more particularly to a method of making such an image sensor having uniform channels of the same optical sensitivity and charge handling capacity.

BACKGROUND OF THE INVENTION

A frame-transfer CCD image sensor in general includes three sections: a photosensing array, known as the A-register; a temporary storage array, known as the B-register; and an output register, known as the C-register. The A-register includes a plurality of parallel channels having channel stop regions between the channels to isolate the channels from each other and a blooming drain region with each channel stop region to control charge overflow. As disclosed in U.S. Pat. No. 4,362,575 to L. F. Wallace, entitled "Method of Making Buried Channel Charge Coupled Device with Means for Controlling Excess Charge", issued Dec. 7, 1982 and in Patent Application Ser. No. 455,332 of E. D. Savoye et al., entitled "Imaging Array Having Higher Sensitivity and a Method of Making The Same" filed Jan. 3, 1983 and assigned to the same assignee as the present application, it has been found desirable to provide channel stops between the channels of the A-register in addition to the blooming drains. As described by Savoye et al. it has been found that in an imager with buried blooming drains, it is only necessary to provide the blooming drains between every other set of channels, i.e. alternate channels, which provides for higher density and greater ease of manufacture of the imager with a higher yield. However, since the positions of the channel stops and blooming drains are normally defined by separate mask steps, they may result in adjacent CCD channels with slightly different widths as a result of misalignment of the masks. For high quality television imagers uniform width channels are required to provide all of the channels with the same optical sensitivity and charge handling capacity.

SUMMARY OF THE INVENTION

The present invention relates to a method of making a charge-coupled device which includes in a substrate of semiconductor material of one conductivity type having a major surface, a plurality of parallel channel regions of the opposite conductivity type in said substrate and extending along said surface, channel stop regions in said substrate and extending along said surface between alternate pairs of adjacent channels, a blooming drain region in said substrate and extending along said surface between the other alternate pairs of adjacent channels and a blooming drain barrier region around each blooming drain region. The method includes the steps of defining the area of the substrate for the channel stop regions simultaneously with the defining either the blooming drain barrier regions or the blooming drain regions, forming the channel stop regions and the blooming drain barrier regions at the same time, and forming the blooming drain regions separately from the channel stop regions.

DETAILED DESCRIPTION OF PREFERRED EMBODIMENTS

Figure 1:
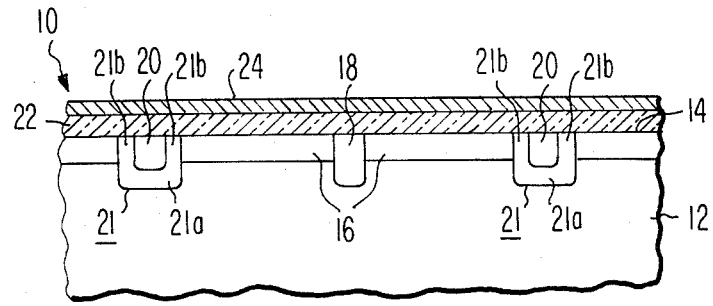
FIG. 1 is a sectional view of a portion of a CCD image sensor made by the present invention.

Referring to FIG. 1, a buried channel CCD image sensor which can be made by the method of the present invention is generally designated as 10. Image sensor 10 includes a substrate 12 of a semiconductor material, such as single crystalline silicon, of one conductivity type, preferably P type, having a major surface 14. A plurality of parallel channel regions 16 of a conductivity type opposite to that of the substrate 12 are in the substrate and extend along the surface 14. Channel stop regions 18 are in the substrate 12 and extend along the surface 14 between alternate adjacent pairs of the channel region 16. Along the substrate surface 14, the channel stop regions 18 are of the same conductivity type as the channel region 16 but less lightly doped or effectively less doped because of compensation. Thus, if the channel regions are of N type conductivity, the channel stop regions 18 along the substrate surface 14 are of N− type conductivity. The bottom portions of the channel regions 18, i.e. the portion deepest in the substrate 12, are of the same conductivity type as the substrate 12 but are more highly doped. Thus, if the substrate 12 is of P type conductivity, the bottom portions of the channel stop regions 18 are of P+ type conductivity.

Blooming drain regions 20 are in the substrate 12 and extend along the substrate surface 14 with each blooming drain region 20 being between the alternate pairs of adjacent channel regions 16 which do not have a channel stop region 18 therebetween. The blooming drain regions 20 are of the same conductivity type as the channel region 16 but have a higher concentration of the conductivity modifier. Thus, for N type channel regions 16, the blooming drain regions 20 are of N+ type conductivity. Surrounding each of the blooming drain regions 20 is a blooming drain barrier region 21. The portion 21a of the blooming drain barrier region 21 under the blooming drain is of the same conductivity type as the substrate 12 but of higher conductivity, i.e. P+ type. Portion 21a forms a barrier for the free electrons between the P− type substrate 12 and the blooming drain region 20. The portions 21b of the blooming drain barrier region 21 at each side of the blooming drain 20 is of the same conductivity as the channel region 16 but of lower net N type doping, i.e. N− type. Preferably, the blooming drain region 20 is uniformly spaced from each of the adjacent channel regions 16.

A channel oxide layer 22 of silicon oxide covers the substrate surface 14, and a plurality of parallel gates 24 of a conductive material, such as doped polycrystalline silicon, are on the channel oxide layer 22 and extend transversely across the channel region 16 as shown in the Wallace U.S. Pat. No. 4,362,575 and the Savoye et al. application.

In the operation of the imager 10, the channel stop regions 18 serve to isolate the channel regions 16 from each other. As described in the Savoye et al. application, the bottom portions 21a of the blooming drain barrier regions 21 serve to deflect electrons generated in the substrate 12 by light entering the back surface of the substrate 12 to the channel regions 16. As described in the Wallace patent and the Savoye et al. application, the blooming drain regions 20 serve to catch any charge that may overflow from the channel region 16. The side portions 21b of the blooming drain barrier regions 21 form a barrier between the channel regions 16 and the blooming drain region 20 and also serve to control the flow of charge into the blooming drain regions 20.

Figure 2:
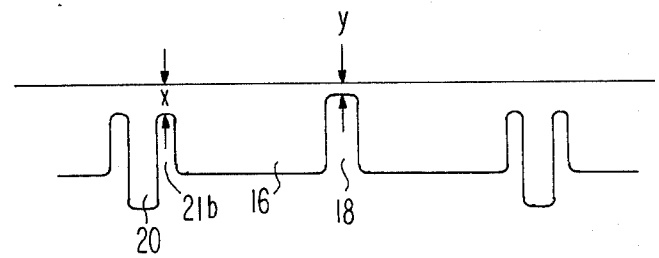
FIG. 2 is a graph showing the charge potential in the various portions of the CCD image sensor.

Although there is a blooming drain region 20 between only alternate pairs of channel regions 16, as shown in FIG. 2, the barrier height across the side portions 21b of the blooming drain barrier regions 21 between the channel region 16 and the blooming drains 20, indicated by x in FIG. 2, is made lower than the barrier height y across the channel stop region 18. This difference in the barrier height will cause any excess charge in the channel region 18 to overflow the lower barrier into the blooming drain regions 20. The difference in the barrier height between the channel stop regions 18 and the blooming drain barrier regions 21 can be achieved either by a fringing field resulting from a voltage applied to the blooming drain higher than the potential of the CCD channel, or by making the distance across the blooming drain barrier regions 21b very small as compared to the width of the channel stop regions 18, or by having the blooming drain barrier regions 21b more N type than the channel stop regions 18.

Figure 3A:
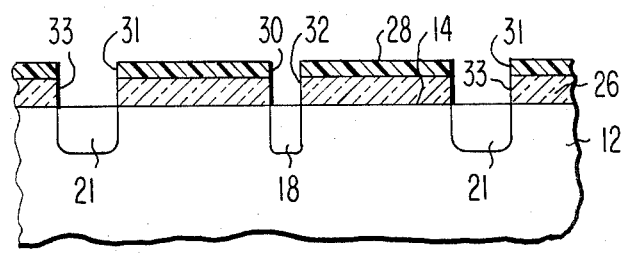
FIGS. 3a-3b are sectional views illustrating sequential steps of one embodiment of the method of the present invention for making the CCD image sensor shown in FIG. 1.

Referring to FIG. 3a, one form of the method of the present invention for making the imager 10 includes forming on the surface 14 of the substrate 12 a masking layer 26, such as of silicon oxide. A silicon oxide masking layer 26 may be formed by heating the substrate surface 14 in an oxygen atmosphere to oxidize the surface. A layer 28 of a photoresist is coated on the masking layer 26. Using standard photolithographic techniques, openings 30 and 31 are defined in the photoresist layer 28 where the channel stop regions 18 and blooming drain barrier regions 21 respectively are to be formed. The areas of the masking layer 26 exposed by the openings 30 and 31 are then removed with a suitable etchant to form the openings 32 and 33 through the masking layer 26 to the substrate surface 14. Using a substrate 12 of P type conductivity, ions of a P type conductivity material, such as boron, are then embedded into the exposed portions of the substrate 12 by ion implantation to form the channel stop regions 18 and the blooming drain barrier regions 21. The implantation can be a single deep implantation with peak concentration at the portion 21a or a double implant with a shallow implantation defining the portion 21b and a deep implantation at the portion 21a of the blooming drain barrier region 21.

Figure 3B:
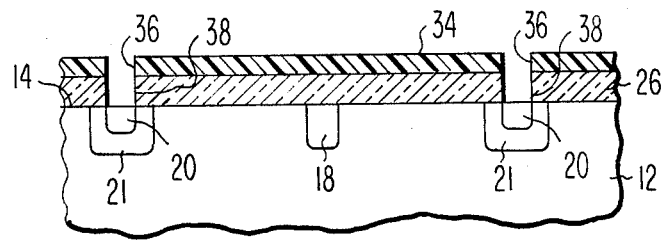

The photoresist layer 28 is then removed and the masking layer 26 is then reformed over the entire area of the substrate surface 14. As shown in FIG. 3b, a new photoresist layer 34 is then coated over the masking layer 26, and, using standard photolithographic techniques, is provided with openings 36 where the blooming drain regions 20 are to be formed. The areas of the masking layer 26 exposed by the openings 36 are then removed with a suitable etchant to form openings 38 through the masking layer 26 to the substrate surface 14. Ions of a suitable conductivity modifier, such as arsenic for N type conductivity, are then embedded into the exposed areas of the substrate 12 to form the blooming drain regions 20 which are surrounded by a blooming drain barrier region 21.

As described in the Wallace patent, the photoresist layer 34 and masking layer 26 are then removed and ions of the desired conductivity type, such as phosphorus for N type, are then embedded into the substrate 12 along the entire surface 14 to form the channel region 16 and the slightly N type doped portions of the channel stop regions 18 and blooming drain barrier regions 21. Also, as described in the Wallace patent and the Savoye et al. application, CCD imager 10 is completed by forming the channel oxide layer 22 on the substrate surface 14 and the conductive gates on the channel oxide layer 22.

In this embodiment of Applicant's method for forming the CCD imager 10 shown in FIGS. 3a and 3b, the relative positions of the channel stops 18 and the blooming drain barrier regions 21 are defined at the same time. The channel stops 18 and the blooming drain barrier regions 21 are then formed simultaneously and the blooming drains 20 are formed separately from the channel stop regions 18 and blooming drain barrier regions 21. Thus, the spacing between the channel stops 18 and the blooming drain barrier regions 21, which defines the width of the channels 16, are controlled so that all of the channels 16 are of the same width. Since the blooming drains 20 are defined by a masking step separate from that of defining the blooming drain barrier regions 21, the blooming drains 20 may not be positioned exactly in the center of the blooming drain barrier regions 21. However, this does not affect the width of the various channel 16. Also, this allows the side portions 21b of the blooming drain barrier regions 21 to be made very narrow so that they provide the desired lower barrier height than the channel stop regions 18.

Figure 4A:
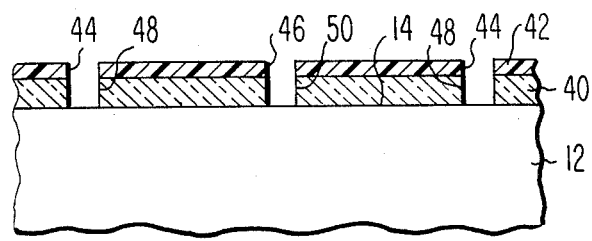
FIGS. 4a-4d are sectional views illustrating the steps of another embodiment of the method of the present invention.

Referring to FIG. 4a, another embodiment of the method of Applicant's invention includes forming a masking layer 40 of silicon oxide on the surface 14 of the substrate 12 and coating the masking layer 40 with a layer 42 of a photoresist material. Using standard photolithographic techniques, alternating openings 44 and 46 are formed in the photoresist layer 42 with the openings 44 being over the areas of the substrate surface 14 where the blooming drain regions 20 are to be formed and the openings 46 being over the areas of the substrate surface 14 where the channel stop regions 18 are to be formed. The areas of the masking layer 40 which are exposed by the openings 44 and 46 are then removed with a suitable etchant to form openings 48 and 50 respectively through the masking layer 40 to the substrate surface 14.

Figure 4B:
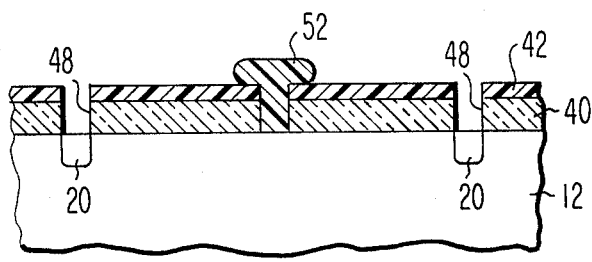
Figure 4C:
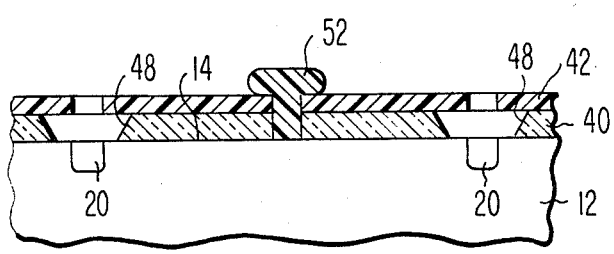
Figure 4D:
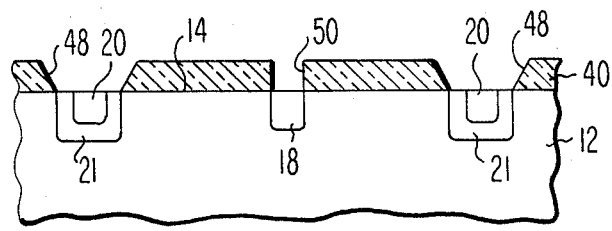

As shown in FIG. 4b, the opening 50 in the masking layer 40 is then coated with a resist material 52 which covers the opening 50 in the masking layer 40. Ions of an appropriate conductivity type material, such as arsenic for N type conductivity, are then embedded into the substrate 12 through the openings 48 to form the blooming drain regions 20. As shown in FIG. 4c, the openings 48 in the masking layer 40 are then enlarged using a suitable etchant to expose portions of the substrate surface 14 on each side of the blooming drain regions 20. As shown in FIG. 4d, the resist layer 42 and the resist cover layer 52 are then removed. Ions of an appropriate conductivity type material, such as boron for P type conductivity, are then embedded in the exposed areas of the substrate 12 through the openings 48 and 50 in the masking layer 40 to form the channel stop regions 18 and the blooming drain barrier regions 21.

As described in the Wallace patent, the masking layer 40 is now removed and ions of an N type conductivity material, such as phosphorus, are embedded in the substrate 12 along the entire surface 14 to form the channel region 16 and the surface regions of the channel stop regions 18 and 18a which contain a low concentration of the conductivity modifier. The channel oxide layer 22 is then formed on the surface 14 and the gates 24 are formed on the channel oxide layer 22.

In this embodiment of Applicant's method shown in FIGS. 4a–4d, the channel stop regions 18 are defined by the same masking step as the blooming drain regions 20 so that the channel stop regions 18 are accurately spaced from the blooming drain regions 20. However, the blooming drain barrier regions 21 are formed at the same time as the channel stop regions 18 and the blooming drain regions 20 are formed separately from the channel stop regions 18 and the blooming drain barrier regions 21. The etching technique for defining the position of the blooming drain barrier regions 21 accurately defines the position of the blooming drain barrier regions 21 with regard to the blooming drain regions 20 so that the channel stop regions 18 and the blooming drain barrier regions 21 are accurately spaced from each other to provide channel regions 16 of uniform width.

This embodiment of Applicant's method has the advantage over that previously described in that it requires only a single masking operation, rather than two masking operations, and the blooming drain barrier regions 21 are self-aligned with the blooming drain regions 20 for accurate spacing of the channel stop regions 18 and the blooming drain barrier regions 21. Also, if desired, after widening the openings 48 in the masking layer 40 but before removing the cover layer 52, an implant of N type conductivity modifiers can be made into the area where the blooming drain barrier regions 21 are then formed to adjust the conductivity of the side portions 21b of the blooming drain barrier regions 21. This will achieve the desired difference in barrier height between the blooming drain barrier regions 21 and the channel stop regions 18.

Figure 5A:
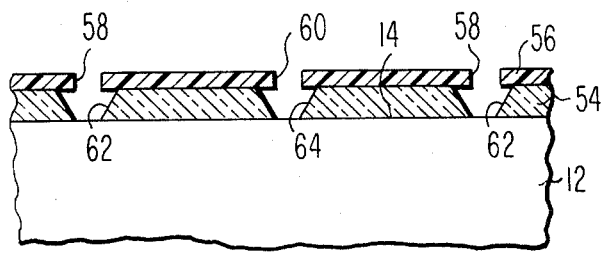
FIGS. 5a-5c are sectional views showing still another embodiment of the method of the present invention.

Referring to FIG. 5a still another embodiment of the method of Applicant's invention includes forming on the surface 14 of a substrate 12 a masking layer 54 of silicon oxide and coating the masking layer 54 with a layer 56 of a photoresist. Using standard photolithographic techniques, the photoresist layer 56 is provided with alternating sets of openings 58 and 60 therethrough. The openings 58 are positioned over the areas of the substrate surface 14 where the blooming drain regions 20 are to be formed and the openings 60 are formed over the areas of the substrate surface 14 where the channel stop regions 18 are to be formed. The exposed areas of the masking layer 54 are then removed with a suitable etchant to form openings 62 and 64 therethrough to the substrate surface 14.

Figure 5B:
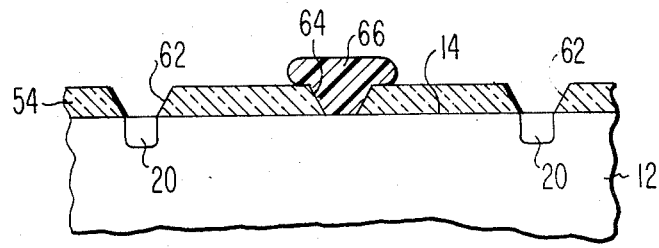
Figure 5C:
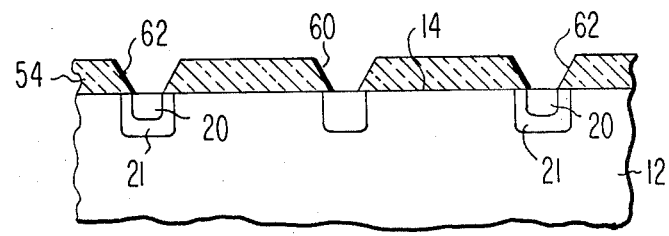

As shown in FIG. 5a, when the opening 62 and 64 are etched, there is a slight etch back of the openings at the interface with the photoresist layer 56 so that the walls of the openings 62 and 64 are slightly tapered. The photoresist layer 56 is then removed and a cover layer 66 of photoresist material is coated over the opening 64 as shown in FIG. 5b. Ions of an appropriate conductivity type material for the blooming drain regions 20, such as arsenic for N type conductivity, are then embedded into the substrate surface 14 through the opening 62 to form the blooming drain regions 20. As shown in FIG. 5c, the cover layer 66 is then removed and ions of a conductivity type appropriate for the channel stop regions 18 and blooming drain barrier regions 21 are then embedded in the substrate 12 through the opening 62 and 64 to form the channel stop regions 18 and blooming drain barrier regions 21. The ions for the channel stop regions 18 and blooming drain barrier regions 21 are preferably embedded in the substrate 12 by ion implantation. Since the walls of the opening 60 and 62 are tapered, the masking layer 54 is thinner at the bottom of the openings 62 so as to allow the implanted ions to pass through the thinner portions of the masking layer 54 and become embedded in the substrate 12 in the area of the surface 14 around the blooming drains 20. In addition, the boron atoms used to form the blooming drain barrier regions 21 have a high diffusion rate in silicon so that during the post implantation anneal the boron atoms will diffuse into the substrate 12 and longitudinally along the direction of the surface 14 to form a blooming drain barrier region 21 completely around ends of the channel stops 20.

The masking layer 54 is then removed and phosphorus ions are implanted into the substrate 12 along the surface 14 to form the channels 16 and the surface regions of the channel stop regions 18 and side portions 21b of the blooming drain barrier regions 21 which are of low impurity concentration as shown in FIG. 1. The channel oxide layer is then formed on the surface 14 and the conductive gates are formed on the channel oxide layer.

In this method of Applicant's invention shown in FIGS. 5a–5c, the channel stops regions 18 are defined at the same time as the blooming drain regions 18 to provide uniform width channels. The channel stop regions 18 and the blooming drain barrier regions 21 are formed at the same time with the blooming drains being formed separately. The blooming drain barrier regions 21 are formed in a self-aligned technique with the blooming drains 20 so that the blooming drain barrier regions 21 are accurately spaced from the channel stop regions 18. This method, like the embodiment of the method described with regard to FIGS. 4a–4d, requires only a single masking step. However, this method has the advantage that it does not require the etch back of the masking layer. In addition, this method provides a narrow blooming drain barrier region between the blooming drains 20 and the adjacent channel 16, which provides the previously described desired deeper well at the channel stop barrier regions side portions 21b than at the channel stop 18.

Thus, there is provided by the present invention methods of forming a CCD image sensor having alternate blooming drains and channels of uniform width which have the same optical sensitivity and charge handling capacities. The methods of the present invention can be carried out with a minimum number of steps and with two forms of the method requiring only one masking operation.

I claim:

1. In a method of making a charge-coupled device image sensor which includes in a substrate of semiconductor material of one conductivity type having a major surface, a plurality of parallel channel regions of the opposite conductivity type in said substrate and extending along said surface, channel stop regions in said substrate and extending along said surface between said alternate pairs of adjacent channel regions, a blooming drain region in said substrate and extending along said surface between the other alternate pairs of channel regions and a blooming drain barrier region in said substrate around each of the blooming drains, the steps of defining the area of the substrate surface for the channel stop regions simultaneously with defining either the blooming drain barrier regions or the blooming drain regions, forming all of the channel stop regions and the blooming drain barrier regions at the same time, and forming the blooming drain regions separately from the channel stop regions and the blooming drain barrier regions.

2. A method in accordance with claim 1 wherein the regions are defined by forming a masking layer over said surface of the substrate and forming openings through the masking layer over the areas of said substrate surface where the regions are to be formed.

3. A method in accordance with claim 2 wherein the openings are formed in the masking layer by coating the masking layer with a layer of a photoresist, photolithographically forming openings in the resist layer and then removing the areas of the masking layer exposed by the openings in the resist layer.

4. A method in accordance with claim 2 wherein the regions are formed by embedding ions of an appropriate conductivity modifier into the substrate through the openings in the masking layer.

5. A method in accordance with claim 2 wherein a first masking layer is formed on the substrate surface, openings are formed in the masking layer over the areas of the substrate surface where the channel stop regions and the blooming drain regions are to be provided, ions of a conductivity modifier are embedded in the substrate through the openings in the first masking layer to form the channel stop regions and the blooming drain barrier regions, a second masking layer is formed on the substrate surface, openings are formed in the second masking layer over the blooming drain barrier regions and ions of a conductivity modifier are embedded in the substrate through the openings in the second masking layer to form the blooming drains.

6. A method in accordance with claim 2 wherein the masking layer is formed with openings therethrough over the areas of the substrate surface where the blooming drain regions and the channel stop regions are to be formed, covering the openings in the masking layer over the areas where the channel stop regions are to be formed, embedding ions of a conductivity modifier into the substrate through the openings in the masking layer which are not covered to form the blooming drain regions, removing the cover, and embedding ions of a conductivity modifier through all of the openings in the masking layer to form the channel stop regions and the blooming drain barrier regions.

7. A method in accordance with claim 4 wherein the channel stop regions and the blooming drain barrier regions are formed by embedding into the substrate ions of a conductivity modified of the same conductivity type as the substrate and the blooming drain regions are formed by embedding into the substrate ions of a conductivity modified of the conductivity type opposite to that of the substrate.

8. A method in accordance with claim 6 in which after forming the blooming drain regions but before removing the covers, the openings in the masking layer which are not covered are enlarged to expose areas of the substrate surface at opposite sides of the blooming drains.

9. A method in accordance with claim 6 in which the openings are covered with a photoresist.

10. A method in accordance with claim 6 in which the openings in the masking layer are formed with tapered side walls, and the ions which form the blooming drain barrier regions are embedded through a thin portion of the tapered side walls to form a narrow portion of the blooming drain barrier region on each side of the blooming drain.

11. A method in accordance with claim 8 in which after enlarging the openings in the masking layer but before removing the cover a conductivity modifier of the same type as the channel regions is embedded into the substrate through the enlarged openings to adjust the barrier height of the blooming drain barrier regions.

* * * * *